(12) United States Patent
Hailu et al.

(10) Patent No.: US 9,998,126 B1
(45) Date of Patent: Jun. 12, 2018

(54) DELAY LOCKED LOOP (DLL) EMPLOYING PULSE TO DIGITAL CONVERTER (PDC) FOR CALIBRATION

(71) Applicant: QUALCOMM Incorporated, San Diego, CA (US)

(72) Inventors: Eskinder Hailu, Cary, NC (US); Bupesh Pandita, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/644,426

(22) Filed: Jul. 7, 2017

(51) Int. Cl.
    *H03L 7/085*    (2006.01)
    *G04F 10/00*    (2006.01)

(52) U.S. Cl.
    CPC ............ *H03L 7/085* (2013.01); *G04F 10/005* (2013.01)

(58) Field of Classification Search
    CPC .............................. H03L 7/085; G04F 10/005
    See application file for complete search history.

(56) References Cited

U.S. PATENT DOCUMENTS

| | | | | |
|---|---|---|---|---|
| 6,192,088 B1* | 2/2001 | Aman | .................... | H04L 27/066 375/326 |
| 7,012,248 B2 | 3/2006 | Paschalidis | | |
| 7,142,027 B2* | 11/2006 | Lee | ........................... | H03L 7/00 327/158 |
| 7,760,124 B2* | 7/2010 | Trescases | .............. | G04F 10/005 327/295 |
| 9,634,826 B1* | 4/2017 | Park | ....................... | G04F 10/005 |
| 9,654,093 B2* | 5/2017 | Yun | ........................ | H03K 7/08 |
| 9,923,710 B2* | 3/2018 | Chan | .................. | H04B 10/6165 |
| 2002/0053950 A1* | 5/2002 | Takeshita | ............. | H03D 13/004 331/17 |
| 2002/0057118 A1* | 5/2002 | Tang | ....................... | H03L 7/081 327/158 |
| 2016/0087638 A1* | 3/2016 | Chae | ....................... | H03L 7/085 327/158 |
| 2017/0085365 A1* | 3/2017 | Ravi | ....................... | H04L 7/042 |
| 2017/0366191 A1* | 12/2017 | Wang | ...................... | H03L 7/091 |

FOREIGN PATENT DOCUMENTS

| | | |
|---|---|---|
| CN | 103684437 B | 8/2016 |
| KR | 101617088 B1 | 5/2016 |
| TW | 201014187 A | 4/2010 |

* cited by examiner

*Primary Examiner* — Thomas J Hiltunen
(74) *Attorney, Agent, or Firm* — Loza & Loza, LLP/Qualcomm (57) ABSTRACT

Aspects of the disclosure are directed to generating a quadrature clock signal from an in-phase clock signal. In accordance with one aspect, a delay locked loop (DLL), including a first pulse to digital converter (PDC) to generate a first pulse width measurement, wherein the first pulse width measurement includes a first sign and a first magnitude; a second pulse to digital converter (PDC) to generate a second pulse width measurement, wherein the second pulse width measurement includes a second sign and a second magnitude; a digital loop filter coupled to the first PDC and the second PDC, the digital loop filter to generate a filtered comparison output based on the first pulse width measurement and the second pulse width measurement; and a first delay generation block to generate a quadrature clock signal based on the filtered comparison output and an in-phase clock signal.

30 Claims, 6 Drawing Sheets

DELAY LOCKED LOOP (DLL) EMPLOYING PULSE TO DIGITAL CONVERTER (PDC) FOR CALIBRATION

TECHNICAL FIELD

This disclosure relates generally to the field of delay locked loop, and, in particular, a delay locked loop for generating a quadrature clock signal from an in-phase clock signal.

BACKGROUND

Several forms of converters may be used in electronic circuits to transform one signal in one domain to another signal in another domain. For example, a pulse to digital converter (PDC) is an electronic circuit which converts a pulse width (measured in units of time) to a digital representation. Different implementations of pulse to digital converters may be used in different applications. However, some pulse to digital converter (PDC) may have a limited linear range, and thus, limit their practical applications. Reference is made to U.S. patent application Ser. No. 15/644,285 to Hailu et al., the disclosure of which is incorporated herein by reference.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides a delay locked loop (DLL). Accordingly, a delay locked loop (DLL), including a first pulse to digital converter (PDC) to generate a first pulse width measurement, wherein the first pulse width measurement includes a first sign and a first magnitude; a second pulse to digital converter (PDC) to generate a second pulse width measurement, wherein the second pulse width measurement includes a second sign and a second magnitude; a digital loop filter coupled to the first PDC and the second PDC, the digital loop filter to generate a filtered comparison output based on the first pulse width measurement and the second pulse width measurement; and a first delay generation block to generate a quadrature clock signal based on the filtered comparison output and an in-phase clock signal.

In one example, the delay locked loop (DLL) further includes a divider block to divide the in-phase clock signal by an integer to generate a first mask pulse, wherein the divider block generates a second mask pulse based on the first mask pulse. The delay locked loop (DLL) may further include a first set reset (SR) latch to generate a first latched clock output based on the in-phase clock signal, and a second set reset (SR) latch to generate a second latched clock output based on the quadrature clock signal. In one example, the delay locked loop (DLL) includes a first AND gate coupled to the first set reset (SR) latch to perform a first logical AND operation of the second mask pulse and the first latched clock output to generate a first clock output, and a second AND gate coupled to the second set reset (SR) latch to perform a second logical AND operation of the first mask pulse and the second latched clock output to generate a second clock output.

In one example, the first clock output is inputted to the first pulse to digital converter (PDC) to generate the first pulse width measurement, and the second clock output is inputted to the second pulse to digital converter (PDC) to generate the second pulse width measurement. In one example, the first pulse to digital converter (PDC) includes a first fractional element and a first integral element. The first pulse width measurement is a concatenation of a first fractional pulse width measurement generated by the first fractional element and a first integral pulse width measurement generated by the first integral element. In one example, the second pulse to digital converter (PDC) includes a second fractional element and a second integral element. The second pulse width measurement is a concatenation of a second fractional pulse width measurement generated by the second fractional element and a second integral pulse width measurement generated by the second integral element.

Another aspect of the disclosure provides a method for generating a quadrature clock signal from an in-phase clock signal including: generating a first pulse width measurement of a first clock output, wherein the first pulse width measurement includes a first sign and a first magnitude; generating a second pulse width measurement of a second clock output, wherein the second pulse width measurement includes a second sign and a second magnitude; generating a filtered comparison output based on the first pulse width measurement and the second pulse width measurement; and generating the quadrature clock signal based on the in-phase clock signal and the filtered comparison output.

In one example, the method further includes dividing the in-phase clock signal by an integer to generate a first mask pulse and a second mask pulse, wherein the integer is greater than or equal to one ("1"). The method may further include generating a first latched clock output based on the in-phase clock signal, performing a first logical AND operation of the second mask pulse and the first latched clock output to generate the first clock output, generating a second latched clock output based on the quadrature clock signal, and performing a second logical AND operation of the first mask pulse and the second latched clock output to generate the second clock output, wherein the first pulse width measurement is a concatenation of a first fractional pulse width measurement and a first integral pulse width measurement, and wherein the second pulse width measurement is a concatenation of a second fractional pulse width measurement and a second integral pulse width measurement.

In one example, a first pulse to digital converter (PDC) is used to generate the first pulse width measurement, the first pulse to digital converter (PDC) including a first fractional element to generate the first fractional pulse width measurement and a first integral element to generate the first integral pulse width measurement. In one example, a second pulse to digital converter (PDC) is used to generate the second pulse width measurement, the second pulse to digital converter (PDC) including a second fractional element to generate the second fractional pulse width measurement and a second integral element to generate the second integral pulse width measurement.

Another aspect of the disclosure provides. An apparatus for generating a quadrature clock signal from an in-phase clock signal, the apparatus including: means for generating a first pulse width measurement of a first clock output, wherein the first pulse width measurement includes a first sign and a first magnitude; means for generating a second pulse width measurement of a second clock output, wherein the second pulse width measurement includes a second sign and a second magnitude; means for generating a filtered comparison output based on the first pulse width measurement and the second pulse width measurement; and means for generating the quadrature clock signal based on the in-phase clock signal and the filtered comparison output.

The apparatus may further include means for dividing the in-phase clock signal by an integer to generate a first mask pulse and a second mask pulse, means for generating a first latched clock output based on the in-phase clock signal, means for performing a first logical AND operation of the second mask pulse and the first latched clock output to generate the first clock output, means for generating a second latched clock output based on the quadrature clock signal, and means for performing a second logical AND operation of the first mask pulse and the second latched clock output to generate the second clock output. In one example, the first pulse width measurement is a concatenation of a first fractional pulse width measurement and a first integral pulse width measurement, and the second pulse width measurement is a concatenation of a second fractional pulse width measurement and a second integral pulse width measurement.

Another aspect of the disclosure provides a computer-readable medium storing computer executable code, operable on a device including at least one processor and at least one memory coupled to the at least one processor, wherein the at least one processor is configured to generate a quadrature clock signal from an in-phase clock signal, the computer executable code including: instructions for causing a computer to provide generate a first pulse width measurement of a first clock output, wherein the first pulse width measurement includes a first sign and a first magnitude; instructions for causing the computer to provide generate a second pulse width measurement of a second clock output, wherein the second pulse width measurement includes a second sign and a second magnitude; instructions for causing the computer to generate a filtered comparison output based on the first pulse width measurement and the second pulse width measurement; and instructions for causing the computer to generate the quadrature clock signal based on the in-phase clock signal and the filtered comparison output.

In one example, the computer-readable medium further includes: instructions for causing the computer to divide the in-phase clock signal by an integer to generate a first mask pulse and a second mask pulse; instructions for causing the computer to generate a first latched clock output based on the in-phase clock signal, and a second latched clock output based on the quadrature clock signal; and instructions for causing the computer to perform a first logical AND operation of the second mask pulse and the first latched clock output to generate the first clock output, and to perform a second logical AND operation of the first mask pulse and the second latched clock output to generate the second clock output.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Pulse to digital converters (PDCs) may use analog components such as RC filters, comparators, etc.) to extract pulse width measurements as an input to the delay locked loop (DLL) for calibration. However, the use of analog components may not scale as well to smaller feature sizes and may be limited in their operating speed. A DLL that uses a PDC with analog components such as resistor capacitor (RC) filters and a comparator to extract a pulse width for DLL calibration may encounter large area usage and some limited frequency response. For example, the PDC may have a bandwidth limited to about 20 MHz or below. In addition, the PDC may provide only a sign error, not error magnitude, as part of the delay comparison for DLL calibration, which may result in increased calibration time.

Figure 1:
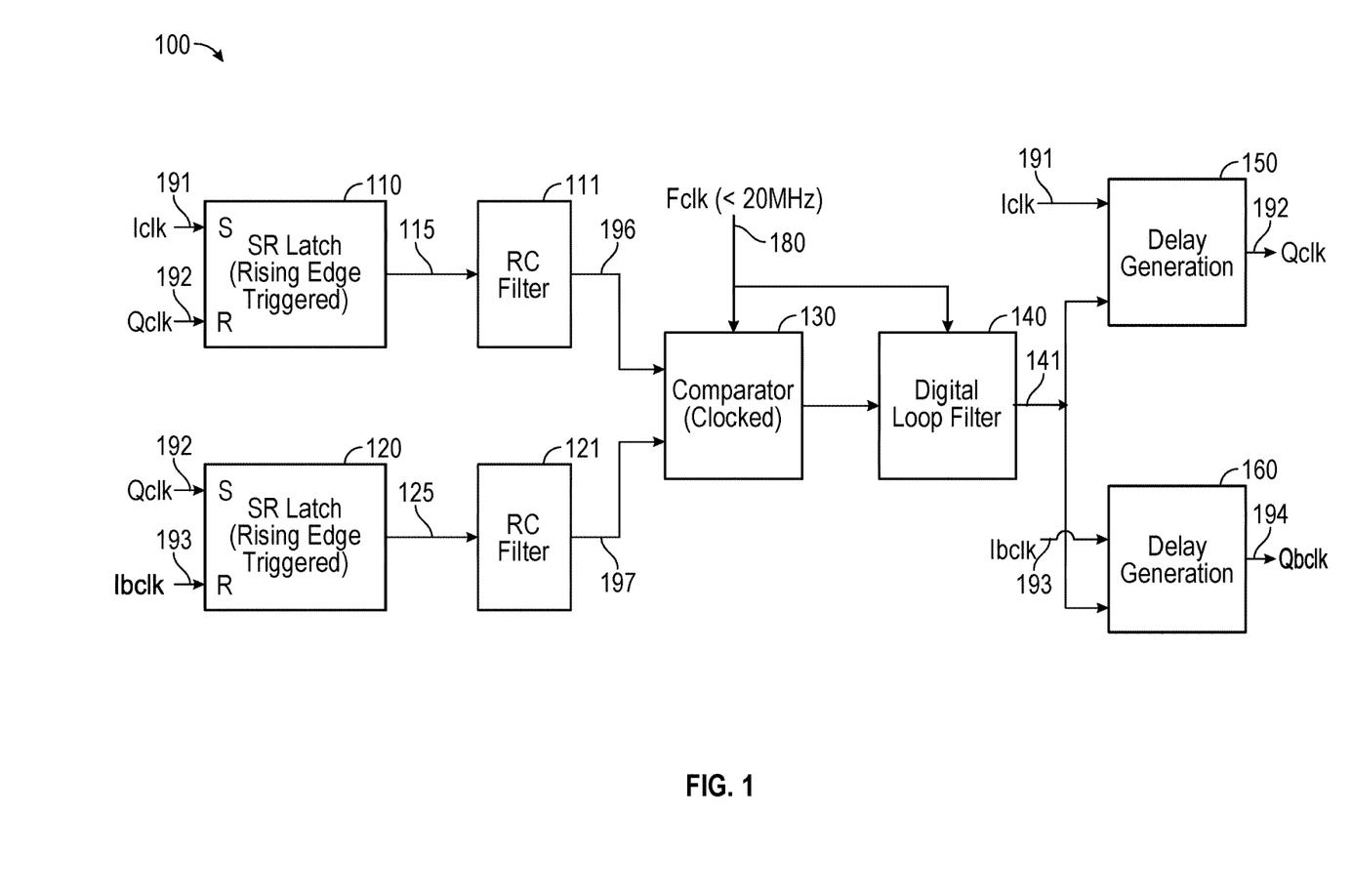
FIG. 1 illustrates an example of a delay locked loop (DLL) which includes some analog components for a DLL input section.

FIG. 1 illustrates an example of a delay locked loop (DLL) 100 which includes some analog components for a DLL input section. In one example, a first set reset (SR) latch 110 accepts a first set input from an in-phase clock signal Iclk 191 and a first reset input from a quadrature clock signal Qclk 192. In one example, the first SR latch 110 is a rising edge-triggered SR latch. Next, the first SR latch 110 provides a first latched clock output 115 to a first RC filter 111. Next, the first RC filter 111 provides a first filtered clock output 196 to a first comparator input of a comparator 130. In one example, a second set reset (SR) latch 120 accepts a second set input from the quadrature clock signal Qclk 192 and a second reset input from a complementary in-phase clock signal Ibclk 193. In one example, the second SR latch 120 is a rising edge-triggered SR latch. Next, the second SR latch 120 provides a second latched clock output 125 to a second RC filter 121. Next, the second RC filter 121 provides a second filtered clock output 197 to a second comparator input of the comparator 130.

In one example, the comparator 130 compares the first comparator input with the second comparator input and provides a comparator output. In one example, the comparator output is a bilevel signal indicating which comparator input is at a higher level. For example, the comparator output may be set to HIGH if the first comparator input is greater than the second comparator input and may be set to LOW if the second comparator input is greater than the first comparator input. In one example, the comparator 130 may be clocked by an input clock signal Fclk 180. For example, the input clock signal Fclk 180 may have a frequency of 20 MHz or less. In one example, the comparator output may indicate only sign information of the comparison between the first comparator input and the second comparator input. In another example, the comparator output is sent as an input to a digital loop filter 140. In one example, the digital loop filter 140 may be clocked by the input clock signal Fclk 180. In one example, the digital loop filter 140 filters the comparator output and provides a filtered comparator output 141.

In one example, the filtered comparator output 141 is sent as a first comparison input to a first delay generation unit 150. In one example, the in-phase clock signal Iclk 191 is sent as a first reference input to the first delay generation unit 150. The first delay generation unit 150 produces a quadrature clock signal Qclk 192 with a quadrature delay relative to the first reference input (i.e., the in-phase clock signal Iclk 191). In one example, the quadrature delay is equivalent to a 90 degree phase delay.

In one example, the filtered comparator output 141 is sent as a second comparison input to a second delay generation unit 160. In one example, the complementary in-phase clock signal Ibclk 193 is sent as a second reference input to the second delay generation unit 160. In one example, the second delay generation unit 160 produces a complementary quadrature clock signal Qbclk 194 with a quadrature delay relative to the second reference input (i.e., the complementary in-phase clock signal Ibclk 193). In one example, the quadrature delay is equivalent to a 90 degree phase delay.

The present disclosure relates to a pulse to digital converter (PDC) for use, for example, in a delay locked loop (DLL). In accordance with the present disclosure, the pulse to digital converter (PDC) may be used to convert a pulse width (measured in units of time) to a digital representation. For example, the PDC may be used in a delay locked loop (DLL) as part of an input comparison circuit for tracking waveform delays. A DLL is an electronics circuit which locks one time delay to another time delay through a feedback mechanism. For example, a DLL may be used to generate quadrature (e.g., in-phase and quadrature) clocks for digital interface circuits such as a serializer/deserializer application. In one example, the PDC may be used within the DLL to extract a pulse width for DLL calibration.

In the present disclosure, linear range is defined as an input range of pulse widths having a proportional output range of digital representations. The term "proportional" is defined to mean an incremental change in pulse width results in a proportional incremental change in the digital representation. As disclosure herein, the implementation of the pulse to digital converter (PDC) helps to extend the linear range of the delay locked loop (DLL).

Figure 2:
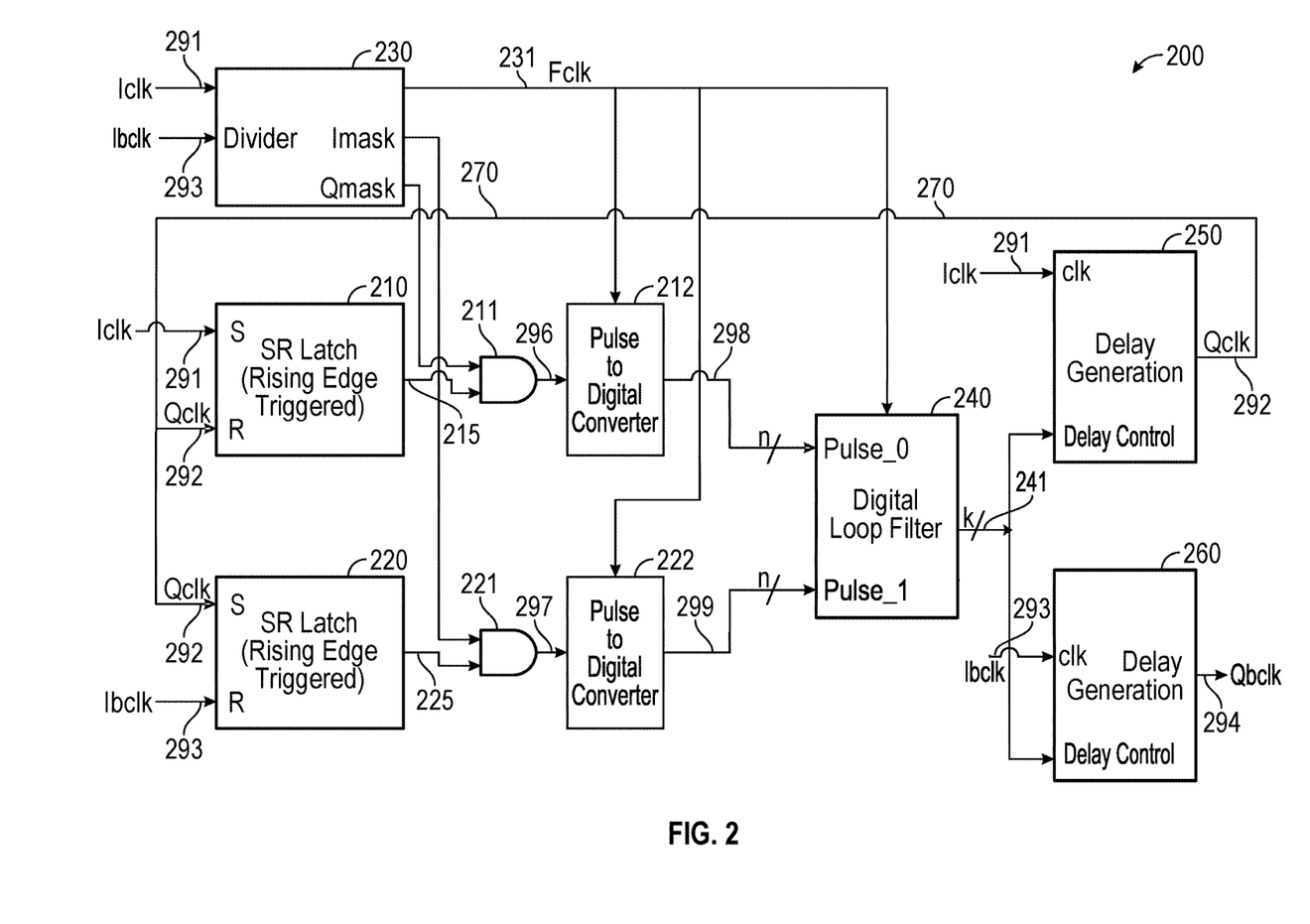
FIG. 2 illustrates an example of a delay locked loop (DLL) which includes pulse to digital converters (PDCs) for a DLL input section in accordance with the present disclosure.

FIG. 2 illustrates an example of a delay locked loop (DLL) 200 which includes pulse to digital converters (PDCs) for a DLL input section in accordance with the present disclosure. In one example, a first set reset (SR) latch 210 accepts a first set input from an in-phase clock signal Iclk 291 and a first reset input from a quadrature clock signal Qclk 292. In one example, the first SR latch 210 is a rising edge-triggered SR latch. Next, the first SR latch 210 may provide a first latched clock output 215 to a first input of an AND gate 211. Next, the first AND gate 211 may provide a first clock output 296 to a first pulse to digital converter (PDC) 212. The first PDC 212 may provide a first digital word 298 as a first input to a digital loop filter 240. In one example, the first digital word 298 provides a first width measurement between the in-phase clock signal Iclk 291 and the quadrature clock signal Qclk 292. In one example, the first width measurement includes both sign and magnitude information.

In one example, a second set reset (SR) latch 220 accepts a second set input from the quadrature clock signal Qclk 292 and a second reset input from a complementary in-phase clock signal Ibclk 293. In one example, the second SR latch 220 is a rising edge-triggered SR latch. Next, the second SR latch 220 may provide a second latched clock output 225 to a first input of a second AND gate 221. Next, the second AND gate 221 may provide a second clock output 297 to a second pulse to digital converter (PDC) 222. The second PDC 222 may provide a second digital word 299 as a second input to the digital loop filter 240. In one example, the second digital word 299 provides a second width measurement between the quadrature clock signal Qclk 292 and the complementary in-phase clock signal Ibclk 293. In one example, the second width measurement includes both sign and magnitude information.

In one example, a divider block 230 may generate a first mask pulse Imask and a second mask pulse Qmask. In one example, a first input to the divider block 230 is the in-phase clock signal Iclk 291 and a second input to the divider block 230 is the complementary in-phase clock signal Ibclk 293. In one example, the divider block 230 generates the first mask pulse Imask by dividing an in-phase clock signal 291 by an integer M to generate the first mask pulse Imask. In one example, the divider block 230 generates the second mask pulse Qmask by shifting the first mask pulse Imask by 90 degrees. In another example, the divider block 230 interpolates the in-phase clock signal Iclk 291 and the complementary in-phase clock Ibclk 293 to generate the second mask pulse Qmask.

The first mask pulse Imask may be a second input of the second AND gate 221. The second mask pulse Qmask may be a second input of the first AND gate 211. In one example, the divider block 230 may create a clock Fclk 231 to control how often the first PDC 212 and the second PDC 222 and the digital loop filter 240 process their inputs. In one example, a divider block 230 setting of unity may allow the two PDCs (i.e., the first PDC 212 and the second PDC 222) and the digital loop filter 240 to operate at a maximum clock rate. In one example, the maximum clock rate results in the shortest calibration time.

In one example, the digital loop filter 240 accepts the first digital word 298 and the second digital word 299 as inputs for a comparison. In one example, the digital loop filter 240 produces a filtered comparison output 241. In one example, the filtered comparison output 241 includes both sign and magnitude information for the comparison. Next, the filtered comparison output 241 is sent as a first input to a first delay generation block 250 and as a first input to a second delay generation block 260. In addition, the in-phase clock signal Iclk 291 is sent as a second input to the first delay generation block 250 and the complementary in-phase clock signal Ibclk 293 is sent as a second input to the second delay generation block 260. In one example, the quadrature clock signal Qclk 292 is the output of the first delay generation block 250 and a complementary quadrature clock signal Qbclk 294 is the output of the second delay generation block B60. In one example, the quadrature clock signal Qclk 292 is provided to the first set reset (SR) latch 210 and the second set reset (SR) latch 220 through a feedback loop 270.

In one example, the first PDC 212 and the second PDC 222 each create an n-bit digital word (e.g., the first digital word 298 and the second digital word 299) which represent pulse width measurements. That is, the first digital word 298 is a first pulse width measurement, and the second digital word 299 is a second pulse width measurement. Next, the digital loop filter 240 accepts the two n-bit digital words and generates a signed k-bit digital control signal (e.g., the filtered comparison output 241) for two delay generation blocks (e.g., the first delay generation block 250 and the second delay generation block 260). In one example, the k-bit digital control signal includes both sign and magnitude information.

Figure 3:
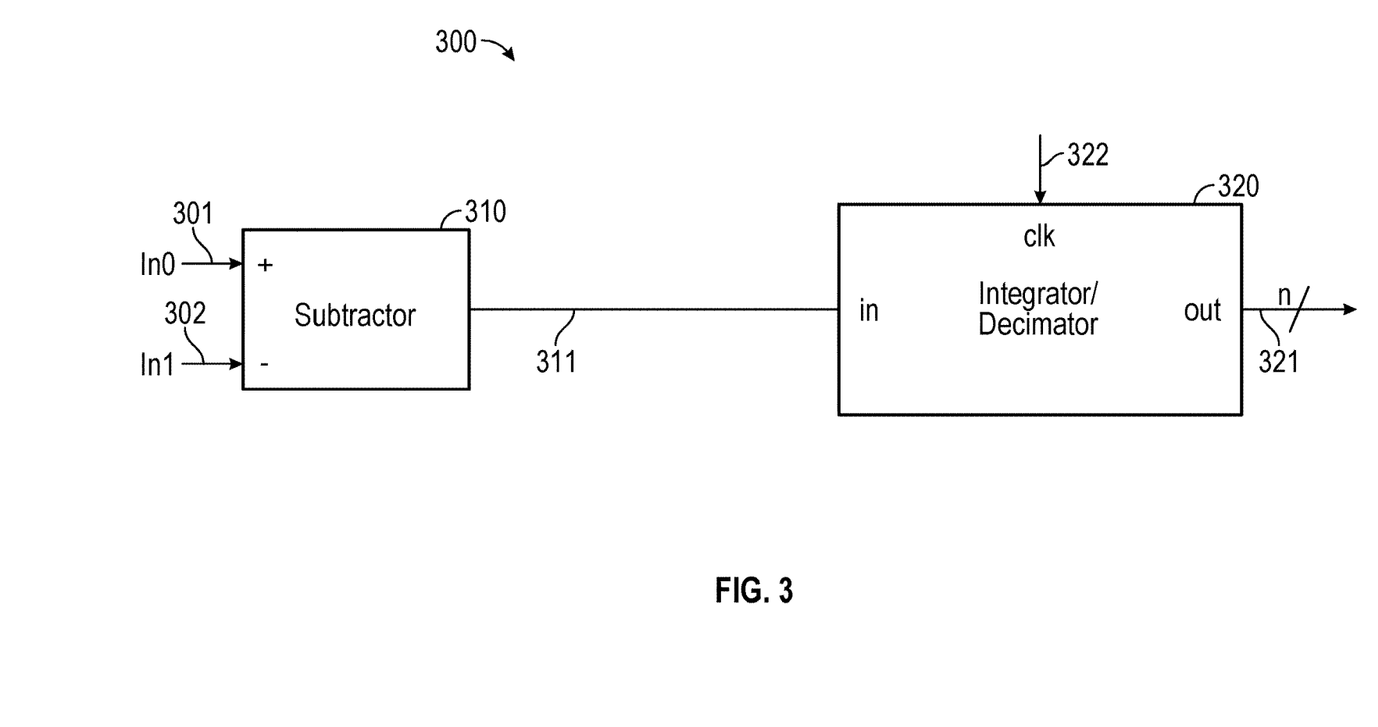
FIG. 3 illustrates an example of a digital loop filter in accordance with the present disclosure.

FIG. 3 illustrates an example of a digital loop filter 300 in accordance with the present disclosure. In one example, the digital loop filter 300 is implemented as the digital loop filter 240 disclosed in FIG. 2. As shown in FIG. 3, the digital loop filter 300 includes a subtractor 310 and an integrator/decimator 320. In one example, the subtractor 310 obtains the difference of a first subtractor input in0 301 and a second subtractor input in1 302. The difference is the output of the subtractor 310 and is labeled as a subtractor output 311. The subtractor output 311 may serve as an input (labeled as "in" in FIG. 3) to the integrator/decimator 320. In one example, the first subtractor input in0 301 is the first digital word 298, and the second subtractor input in1 302 is the second digital word 299.

In one example, the integrator/decimator 320 integrates the subtractor outputs 311 and decimates the subtractor outputs 311. In one example, integrating the subtractor outputs 311 is defined as averaging the subtractor outputs 311. The averaging may or may not including weighting; that is, having weighted averages of the subtractor outputs 311. In one example, decimates is defined as reducing the sampling density. That is, in one example, the quantity of the subtractor outputs 311 is reduced based on a desired resolution, which may be dictated by a particular application or by a user. In one example, the integrator/decimator 320 operates synchronously with an input clock signal 322 (which is labeled as "clk" in FIG. 3). The output 321 (labeled as "out" in FIG. 3) of the integrator/decimator 320 is the same as the filtered comparison output 241 (shown in FIG. 2).

Figure 4:
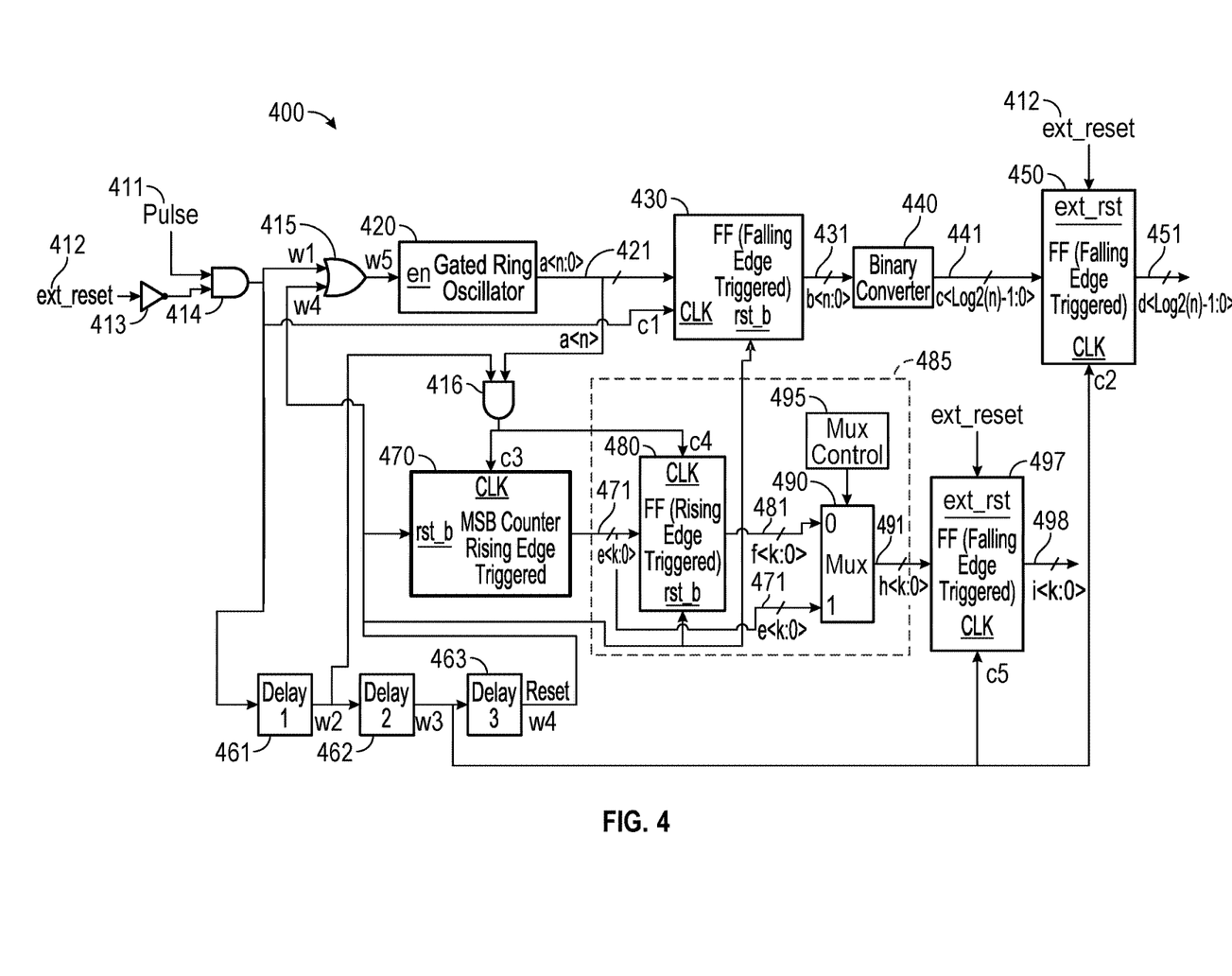
FIG. 4 illustrates an example pulse to digital converter (PDC) in accordance with the present disclosure.

FIG. 4 illustrates an example pulse to digital converter (PDC) 400 in accordance with the present disclosure. In one example, the pulse to digital converter (PDC) 400 shown in FIG. 4 is used as the two PDCs (i.e., PDC 212 and PDC 222) shown in FIG. 2. In one aspect, the pulse to digital converter (PDC) 400 includes three features: a fractional element, an integral element and an anti-glitch circuit.

As shown in FIG. 4, an input pulse signal 411 and an external reset signal ext_reset 412 serve as inputs to the PDC 400. The input pulse signal 411 and an inverted external reset signal (generated by inverter 413) are sent to a first AND gate 414 to produce a first waveform w1. In one example, the first waveform w1 is generated as a logical AND operation on the input pulse signal 411 and the inverted external reset signal. In one example, the first waveform w1 is a pulsed waveform with pulse width W. Next, the first waveform w1 is sent to a first delay element 461 to produce a second waveform w2. The second waveform w2 is a delayed replica of the first waveform w1. A time delay between the first waveform w1 and the second waveform w2 is given by T1.

Next, the second waveform w2 is sent to a second delay element 462 to produce a third waveform w3. In one example, the third waveform w3 is a delayed replica of the second waveform w2. In one example, a time delay between the second waveform w2 and the third waveform w3 is given by T2. Next, the third waveform w3 is sent to a third delay element 463 to produce a fourth waveform w4. The fourth waveform w4 is a delayed replica of the third waveform w3. In one example, a time delay between the third waveform w3 and the fourth waveform w4 is given by T3. In the example of FIG. 4, the fourth waveform w4 and the first waveform w1 are inputs to an OR gate 415. In one example, the OR gate output is a fifth waveform w5.

As shown in FIG. 4, the fifth waveform w5 is inputted to a gated ring oscillator 420. In one example, the input to the gated ring oscillator 420 serves as an enable signal labeled as "en" in FIG. 4. In one example, the gated ring oscillator 420 outputs a first state word a<n:0> 421. In one example, the first state word a<n:0> 421 includes (n+1) bits. For example, the first state word a<n:0> 421 represents a cumulative count of the gated ring oscillator state transitions. In one example, gated ring oscillator state transitions are state transitions of the gated ring oscillator. State transition is a change of state of a digital electronic circuit. In a digital electronic circuit with two states, the state transition is from LOW to HIGH or HIGH to LOW. In one example, the gated ring oscillator 420 has two states. In one example the gated ring oscillator 420 has an oscillation period T when the input to the gated ring oscillator is HIGH, i.e., enabled.

Next, the first state word a<n:0> 421 may serve as an input to a first flip flop 430. In one example, the first flip flop 430 receives the first waveform w1 which is being used as a first clock signal c1 and the fourth waveform w4 which is being used as a first reset signal labeled in the first flip flop 430 as "rst_b". In one example, the first flip flop 430 is a falling edge-triggered flip flop. In one example, the first flip output is a second state word b<n:0> 431. In one example, the second state word b<n:0> 431 includes (n+1) bits. For example, the second state word b<n:0> 431 may represent a latched cumulative count of the gated ring oscillator state transitions.

Next, the second state word b<n:0> 431 may serve as an input to a binary converter 440. The binary converter may convert phases to thermometer codes and then to binary codes. In one example, the binary converter 440 converts the second state word b<n:0>431 to a thermometer code and then to a binary code. The binary converter 440 output is a third state word c<log 2(n)−1:0> 441. In one example, the third state word c<log 2(n)−1:0> 441 includes log 2(n) bits.

For example, the third state word c<log 2(n)–1:0> 441 may represent a binary cumulative count of the gated ring oscillator state transitions.

Next, the third state word c<log 2(n)–1:0> 441 may serve as an input to a second flip flop 450. In one example, the second flip flop 450 receives the third waveform w3 which is being used as a second clock signal c2 and the second flip flop 450 also receives a second reset signal (labeled in the second flip flop 450 as "ext_rst") from the external reset signal ext_reset 412. In one example, the second flip flop 450 is a falling edge-triggered flip flop. In one example, the second flip flop output is a fourth state word d<log 2(n)–1:0> 451. In one example, the fourth state word d<log 2(n)–1:0> 451 includes log 2(n) bits. For example, the fourth state word d<log 2(n)–1:0> 451 represents a synchronized binary cumulative count of the gated ring oscillator state transitions.

In one example, a fractional element of the pulse to digital converter (PDC) 400 includes the gated ring oscillator 420, the first flip flop 430, the binary converter 440, and the second flip flop 450. For example, the fractional element uses internal interpolated states of the gated ring oscillator state transitions to measure pulse width of the input pulse signal 411 as fractions of the oscillation period T to produce a fractional measurement given by the fourth state word d<log 2(n)–1):0> 451. The fractional element provides a fractional pulse width measurement of the input pulse signal 411. In one example, the fractional pulse width measurement provides a fine temporal resolution of pulse width measurement of the input pulse signal 411. In one example, the fine temporal resolution is measured against the temporal resolution of a gated ring oscillator without an interpolator.

In addition, for example, the first state word a<n:0> 421 and the second waveform w2 are inputted to a second AND gate 416. The second AND gate 416 may generate a clock signal shown as a third clock signal c3 and a fourth clock signal c4. In one example, the third clock signal c3 and the fourth clock signal c4 are the same clock signal. The third clock signal c3 serves as a clock input to a most significant bit (MSB) counter 470. In one example, the MSB counter 470 is triggered on a rising edge of the third clock signal c3. In addition, the MSB counter 470 may receive the fourth waveform w4 which is used as a third reset signal labeled in the MSB counter 470 as "rst_b". In one example, the MSB counter 470 output is a fifth state word e<k:0> 471. In one example, the fifth state word e<k:0> 471 includes (k+1) bits. For example, the fifth state word e<k:0> 471 represents a MSB count of the gated ring oscillator MSB transitions. In one example, the MSB transitions of the gated ring oscillator are state changes of the most significant bit (MSB) of the first state word a<n:0> 421 from a HIGH state to a LOW state.

Since the first state word a<n:0> 421 is derived from the fractional element of the PDC, and since the clock input to the MSB counter 470 is derived from the first state word a<n:0> 421 (through the second AND gate 416), the clock input to the MSB counter 470 is derived from the fractional element of the PDC 400. Thus, there is a coupling between the fractional element and the integral element of the PDC 400 through the third clock signal c3.

Next, the fifth state word e<k:0> 471 serves as an input to a third flip flop 480. In one example, the third flip flop 480 receives the fourth clock signal c4 from the second AND gate 416 and the third flip flop 480 receives the fourth waveform w4 which is used as a fourth reset signal labeled in the third flip flop 480 as "rst_b". In one example, the third flip flop 480 is a falling edge-triggered flip flop. In one example, the third flip flop 480 output is a sixth state word f<k:0> 481. In one example, the sixth state word f<k:0> 481 includes (k+1) bits. For example, the sixth state word f<k:0> 481 may represent a latched MSB count of the gated ring oscillator MSB transitions.

Next, the fifth state word e<k:0> 471 may serve as a first input and the sixth state word f<k:0> 481 may serve as a second input to a multiplexer 490. The output of the multiplexer 490 may be selected by a multiplexer controller 495. In one example, the multiplexer 490 uses a comparison logic to select the multiplexer output. In one example, the multiplexer controller 495 may compare the fifth state word e<k:0> 471 and the sixth state word f<k:0> 481 using the comparison logic to select the output of the multiplexer 490. In one example, the multiplexer controller 495 may use the following comparison logic to select the multiplexer output:

if (f<k:0>=e<k:0>) then mux control=1, or
if (f<k:0>≠e<k:0>) then:
if a<(n+1)/2–1>=1 then mux control=0 or
if a<(n+1)/2–1>=0 then mux control=1.

In this example, mux control=0 selects the output to be the second input to multiplexer 490 and mux control=1 selects the output to be the first input to multiplexer 490. Also, in this example, a<(n+1)/2–1> represents a middle bit of the first state word a<n:0> 421 which has (n+1) bits. For example, if n=7, then the first state word a<(n+1)/2–1>=a<3>, a middle bit.

In one example, the multiplexer 490 outputs a seventh state word h<k:0> 491. In one example, the seventh state word h<k:0> 491 includes (k+1) bits. For example, the seventh state word h<k:0> 491 represents a selected latched MSB count of the gated ring oscillator MSB transitions.

Next, the seventh state word h<k:0> 491 may serve as an input to a fourth flip flop 497. In one example, the fourth flip flop 497 receives the third waveform w3 which is used as a fifth clock signal c5 and the fourth flip flop 497 receives a fifth reset signal (labeled in the fourth flip flop 497 as "ext_rst") from the external reset signal ext_reset 412. In one example, the fourth flip flop 497 is a falling edge-triggered flip flop. In one example, the fourth flip flop 497 output is an eighth state word i<k:0> 498. In one example, the eighth state word i<k:0> 498 includes (k+1) bits. For example, the eighth state word i<k:0> 498 represents a synchronized MSB count of the gated ring oscillator MSB transitions.

In one example, an integral element of the pulse to digital converter (PDC) 400 includes the MSB counter 470, the third flip flop 480, the multiplexer 490 and the fourth flip flop 497. The MSB counter 470 along with the third flip flop 480, the multiplexer 490 and the fourth flip flop 497 provide increased linear range of pulse width measurement of the input pulse signal 411. For example, the integral element uses MSB transitions of the gated ring oscillator state transitions to measure pulse width of the input pulse signal 411 as multiples of the oscillation period T to produce an integral measurement given by the eighth state word i<k:0> 498. The integral element provides an integral pulse width measurement of the input pulse signal 411. In one example, the integral pulse width measurement provides a temporal range of pulse width measurement of the input pulse signal 411 that may be widened by adding an extensible q quantity of bits to the MSB counter; that is, a wider temporal range. In one example, q is an integer.

In one example, the output of the pulse to digital converter (PDC) 400 may be represented as a concatenation of the synchronized MSB count of the gated ring oscillator MSB transitions and the synchronized binary cumulative count of the gated ring oscillator state transitions. In one example, the output of the PDC 400 may be expressed as {i<k:0>,d<log 2(n)−1:0>} where {x,y} denotes the concatenation of state word x and state word y. In one example, concatenation is the joining of two ordered elements into a larger single ordered element. In one example, the concatenation may be implemented by a cascade of two registers, for example, two shift registers.

In one example, an anti-glitch circuit 485 of the PDC 400 includes the third flip flop 480, the multiplexer 490 and the multiplexer controller 495. The anti-glitch circuit synchronizes the input pulse signal 411 with the timing of the gated ring oscillator 420. That is, if more than one counter bit is changing state at the same clock transition, the multiplexer controller 495 compares a current counter state with a previous counter state to eliminate a counter transition ambiguity. The anti-glitch circuit 485 obtains a monotonic input-output relationship to avoid problems associated with the asynchronicity between the input pulse signal 411 and the timing of the gated ring oscillator 420. The components of the anti-glitch circuit 485 are shown within a dashed rectangle in FIG. 4.

Figure 5:
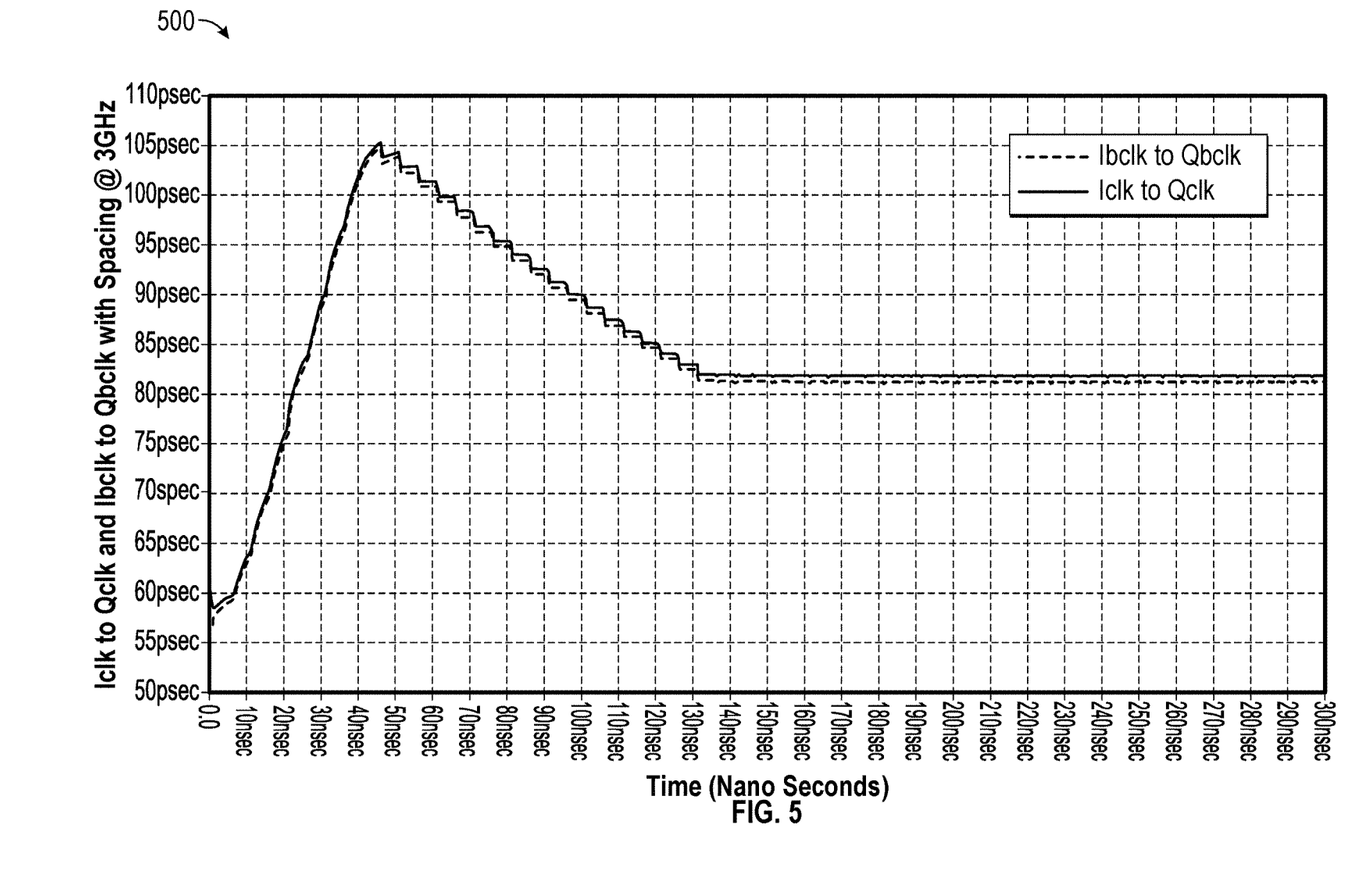
FIG. 5 illustrates an example of a simulation graph of a first relative time offset of the in-phase clock signal Iclk and the quadrature clock signal Qclk as a function of time, and a second relative time offset of the complementary in-phase clock signal Ibclk and the complementary quadrature clock signal Qbclk as a function of time.

FIG. 5 illustrates an example of a simulation graph 500 of a first relative time offset (in units of picoseconds) of the in-phase clock signal Iclk (e.g., Iclk 291 shown in FIG. 2) and the quadrature clock signal Qclk (e.g., Qclk 292 shown in FIG. 2) as a function of time, and a second relative time offset (in units of picoseconds) of the complementary in-phase clock signal Ibclk (e.g., Ibclk 293 shown in FIG. 2) and the complementary quadrature clock signal Qbclk (e.g., Qbclk 294 shown in FIG. 2) as a function of time.

In one example, the simulation graph 500 shows the results of the DLL calibration using pulse to digital converters. For example, a clock signal having a frequency of 3 GHz would result in a spacing between the in-phase clock signal Iclk and the quadrature clock signal Qclk to be 83 picoseconds. And, the spacing between the complementary in-phase clock signal Iclk and the complementary quadrature clock signal Qclk is also 83 picoseconds. In the simulation graph 500, the delay locked loop (DLL) 200 (as shown in FIG. 2) reaches a steady state operation in less than 200 nanoseconds. In the simulation graph 500, the divider block 230 setting is set to 10 and the digital loop filter 240 and the two PDCs 212, 222 are each operating at a frequency of 300 MHz.

Figure 6:
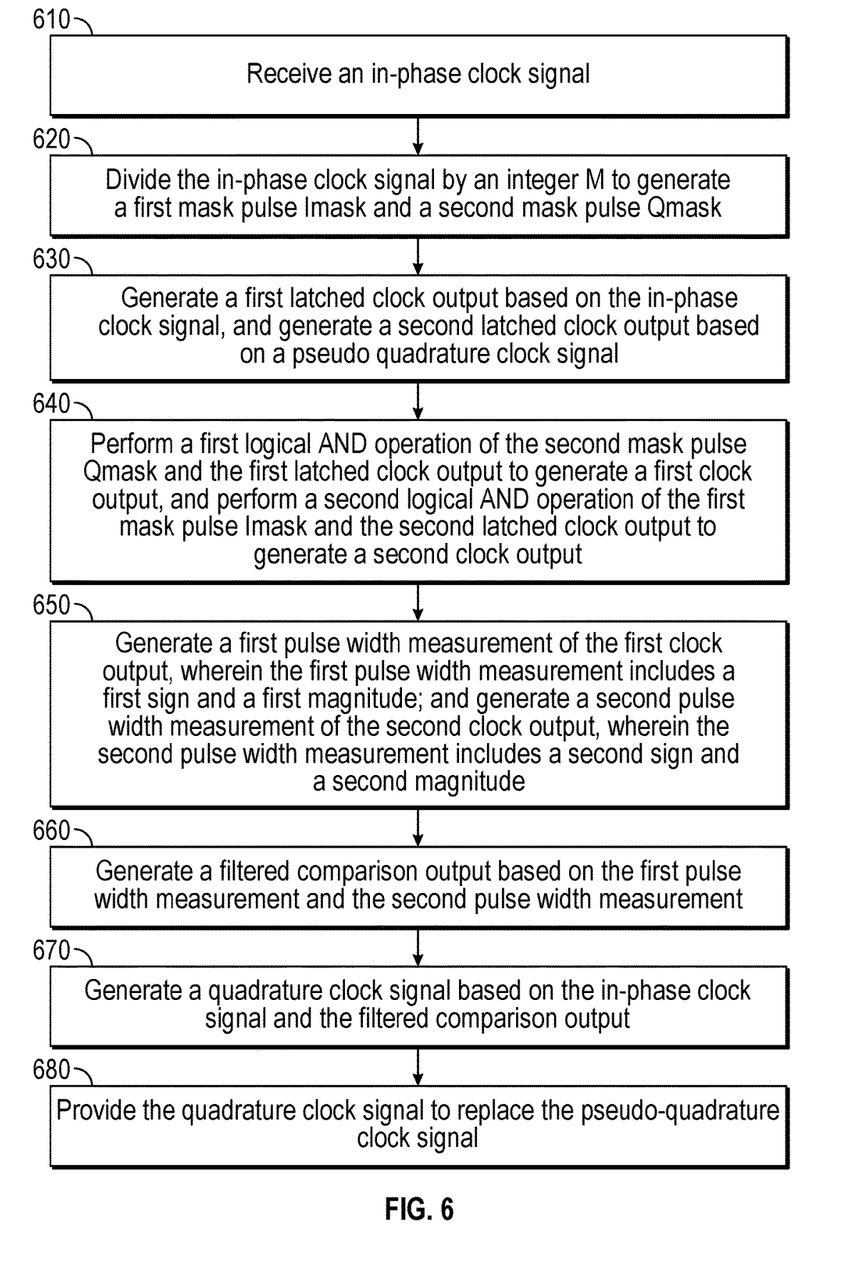
FIG. 6 illustrates an example flow diagram for generating a quadrature clock signal from an in-phase clock signal using a delay locked loop (DLL) which includes pulse to digital converters (PDCs) for a DLL input section.

FIG. 6 illustrates an example flow diagram 600 for generating a quadrature clock signal from an in-phase clock signal using a delay locked loop (DLL) which includes pulse to digital converters (PDCs) for a DLL input section. In block 610, receive an in-phase clock signal. In one example, the in-phase clock signal is received by a divider block (e.g., divider block 230 shown in FIG. 2).

In block 620, divide the in-phase clock signal by an integer M to generate a first mask pulse Imask and a second mask pulse Qmask. In one example, the divider block (e.g., divider block 230 shown in FIG. 2) divides the in-phase clock signal. In one example, the value of the integer M may be any integer value greater than or equal to one ("1"). For example, the value of the integer M may be chosen based on device capabilities.

In one example, the divider block generates the first mask pulse Imask by dividing the in-phase clock signal by the integer M and generates the second mask pulse Qmask by shifting the first mask pulse Imask by 90 degrees. In another example, the divider block interpolates the in-phase clock signal and a complementary in-phase clock (e.g., Ibclk 293 as shown in FIG. 2) to generate the second mask pulse Qmask.

In block 630, generate a first latched clock output based on the in-phase clock signal, and generate a second latched clock output based on a pseudo quadrature clock signal. In one example, the first latched clock output and the second latched clock output are generated by two set reset (SR) latches, respectively. The two SR latches may be SR latch 210, 220 shown in FIG. 2. In one example, prior to generating a quadrature clock signal (as described in block 670), the pseudo quadrature clock signal may be a clock signal with an arbitrary phase with respect to the in-phase clock signal. Once the quadrature clock signal (as described in block 670) is generated, the pseudo quadrature clock signal is the quadrature clock signal.

In block 640, perform a first logical AND operation of the second mask pulse Qmask and the first latched clock output to generate a first clock output, and perform a second logical AND operation of the first mask pulse Imask and the second latched clock output to generate a second clock output. In one example, the first logical AND operation and the second logical AND operation are performed by two AND gates (e.g., AND gates 211, 221 shown in FIG. 2).

In block 650, generate a first pulse width measurement of the first clock output, wherein the first pulse width measurement includes a first sign and a first magnitude; and generate a second pulse width measurement of the second clock output, wherein the second pulse width measurement includes a second sign and a second magnitude. In one example, the first pulse width measurement and the second pulse width measurement are generated by two pulse to digital converters (PDCs) (e.g., PDC 212, 222 shown in FIG. 2). In one example, each of the two PDCs include a fractional element and an integral element. And, in one example, one or more of the two PDCs include an anti-glitch circuit.

In one example, the PDC generates a fractional pulse width measurement and an integral pulse width measurement of the clock output, and concatenates the fractional pulse width measurement and the integral pulse width measurement to generate a pulse width measurement with a sign and a magnitude.

In block 660, generate a filtered comparison output based on the first pulse width measurement and the second pulse width measurement. In one example, the filtered comparison output is generated by a digital loop filter (e.g., digital loop filter 240 shown in FIGS. 2 & 3). As shown in FIG. 3, the digital loop filter may include a subtractor and an integrator/decimator. In one example, the filtered comparison output is generated by obtaining the difference between the first pulse width measurement and the second pulse width measurement, and then integrating and decimating the difference. In one example, the difference is the subtractor output 311 shown in FIG. 3.

In block 670, generate a quadrature clock signal based on the in-phase clock signal and the filtered comparison output. In one example, the quadrature clock signal is generated by a delay generation block (e.g., a first delay generation block 250 shown in FIG. 2). In one example, a complementary quadrature clock signal is also generated based on a complementary in-phase clock signal and the filtered comparison output. In one example, the complementary quadrature clock signal is generated by a delay generation block (e.g., a second delay generation block 260 shown in FIG. 2).

In block 680, provide the quadrature clock signal to replace the pseudo-quadrature clock signal in block 630. In one example, the quadrature clock signal is provided to one or more of the two SR latches through a feedback loop (e.g., feedback loop 270 as shown in FIG. 2).

In one aspect, one or more of the steps in FIG. 6 for generating a quadrature clock signal from an in-phase clock signal using a delay locked loop (DLL) which includes pulse to digital converters (PDCs) for a DLL input section may be executed by one or more processors which may include hardware, software, firmware, etc. In one aspect, one or more of the steps in FIG. 6 may be executed by one or more processors which may include hardware, software, firmware, etc. The one or more processors, for example, may be used to execute software or firmware needed to perform the steps in the flow diagram of FIG. 14. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in the processing system, external to the processing system, or distributed across multiple entities including the processing system. The computer-readable medium may be embodied in a computer program product. By way of example, a computer program product may include a computer-readable medium in packaging materials. The computer-readable medium may include software or firmware for generating a quadrature clock signal from an in-phase clock signal. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:
1. A delay locked loop (DLL), comprising:
   a first pulse to digital converter (PDC) to generate a first pulse width measurement, wherein the first pulse width measurement includes a first sign and a first magnitude;
   a second pulse to digital converter (PDC) to generate a second pulse width measurement, wherein the second pulse width measurement includes a second sign and a second magnitude;
   a digital loop filter coupled to the first PDC and the second PDC, the digital loop filter to generate a filtered comparison output based on the first pulse width measurement and the second pulse width measurement; and
   a first delay generation block to generate a quadrature clock signal based on the filtered comparison output and an in-phase clock signal.
2. The delay locked loop (DLL) of claim 1, further comprising a divider block to divide the in-phase clock signal by an integer to generate a first mask pulse.
3. The delay locked loop (DLL) of claim 2, wherein the divider block generates a second mask pulse based on the first mask pulse.
4. The delay locked loop (DLL) of claim 3, further comprising a first set reset (SR) latch to generate a first latched clock output based on the in-phase clock signal, and a second set reset (SR) latch to generate a second latched clock output based on the quadrature clock signal.
5. The delay locked loop (DLL) of claim 4, further comprising:
   a first AND gate coupled to the first set reset (SR) latch to perform a first logical AND operation of the second mask pulse and the first latched clock output to generate a first clock output, and
   a second AND gate coupled to the second set reset (SR) latch to perform a second logical AND operation of the first mask pulse and the second latched clock output to generate a second clock output.
6. The delay locked loop (DLL) of claim 5, wherein the first clock output is inputted to the first pulse to digital converter (PDC) to generate the first pulse width measurement, and the second clock output is inputted to the second pulse to digital converter (PDC) to generate the second pulse width measurement.
7. The delay locked loop (DLL) of claim 1, wherein the first pulse to digital converter (PDC) comprises a first fractional element and a first integral element.
8. The delay locked loop (DLL) of claim 7, wherein the first pulse width measurement is a concatenation of a first fractional pulse width measurement generated by the first fractional element and a first integral pulse width measurement generated by the first integral element.
9. The delay locked loop (DLL) of claim 8, wherein the second pulse to digital converter (PDC) comprises a second fractional element and a second integral element.
10. The delay locked loop (DLL) of claim 9, wherein the second pulse width measurement is a concatenation of a second fractional pulse width measurement generated by the second fractional element and a second integral pulse width measurement generated by the second integral element.
11. A method for generating a quadrature clock signal from an in-phase clock signal comprising:
   generating a first pulse width measurement of a first clock output, wherein the first pulse width measurement includes a first sign and a first magnitude;
   generating a second pulse width measurement of a second clock output, wherein the second pulse width measurement includes a second sign and a second magnitude;
   generating a filtered comparison output based on the first pulse width measurement and the second pulse width measurement; and
   generating the quadrature clock signal based on the in-phase clock signal and the filtered comparison output.
12. The method of claim 11, further comprising dividing the in-phase clock signal by an integer to generate a first mask pulse and a second mask pulse.
13. The method of claim 12, wherein the integer is greater than or equal to one ("1").
14. The method of claim 12, further comprising generating a first latched clock output based on the in-phase clock signal.
15. The method of claim 14, further comprising performing a first logical AND operation of the second mask pulse and the first latched clock output to generate the first clock output.
16. The method of claim 15, further comprising generating a second latched clock output based on the quadrature clock signal.
17. The method of claim 16, further comprising performing a second logical AND operation of the first mask pulse and the second latched clock output to generate the second clock output.
18. The method of claim 17, wherein the first pulse width measurement is a concatenation of a first fractional pulse width measurement and a first integral pulse width measurement.
19. The method of claim 18, wherein the second pulse width measurement is a concatenation of a second fractional pulse width measurement and a second integral pulse width measurement.
20. The method of claim 19, wherein a first pulse to digital converter (PDC) is used to generate the first pulse width measurement, the first pulse to digital converter (PDC) comprising a first fractional element to generate the first fractional pulse width measurement and a first integral element to generate the first integral pulse width measurement.
21. The method of claim 20, wherein a second pulse to digital converter (PDC) is used to generate the second pulse width measurement, the second pulse to digital converter (PDC) comprising a second fractional element to generate the second fractional pulse width measurement and a second integral element to generate the second integral pulse width measurement.
22. An apparatus for generating a quadrature clock signal from an in-phase clock signal, the apparatus comprising:
   means for generating a first pulse width measurement of a first clock output, wherein the first pulse width measurement includes a first sign and a first magnitude;
   means for generating a second pulse width measurement of a second clock output, wherein the second pulse width measurement includes a second sign and a second magnitude;
   means for generating a filtered comparison output based on the first pulse width measurement and the second pulse width measurement; and
   means for generating the quadrature clock signal based on the in-phase clock signal and the filtered comparison output.
23. The apparatus of claim 22, further comprising means for dividing the in-phase clock signal by an integer to generate a first mask pulse and a second mask pulse.
24. The apparatus of claim 23, further comprising means for generating a first latched clock output based on the in-phase clock signal.

25. The apparatus of claim 24, further comprising means for performing a first logical AND operation of the second mask pulse and the first latched clock output to generate the first clock output.

26. The apparatus of claim 25, further comprising means for generating a second latched clock output based on the quadrature clock signal.

27. The apparatus of claim 26, further comprising means for performing a second logical AND operation of the first mask pulse and the second latched clock output to generate the second clock output.

28. The apparatus of claim 27, wherein the first pulse width measurement is a concatenation of a first fractional pulse width measurement and a first integral pulse width measurement, and the second pulse width measurement is a concatenation of a second fractional pulse width measurement and a second integral pulse width measurement.

29. A computer-readable medium storing computer executable code, operable on a device comprising at least one processor and at least one memory coupled to the at least one processor, wherein the at least one processor is configured to generate a quadrature clock signal from an in-phase clock signal, the computer executable code comprising:
  instructions for causing a computer to provide generate a first pulse width measurement of a first clock output, wherein the first pulse width measurement includes a first sign and a first magnitude;
  instructions for causing the computer to provide generate a second pulse width measurement of a second clock output, wherein the second pulse width measurement includes a second sign and a second magnitude;
  instructions for causing the computer to generate a filtered comparison output based on the first pulse width measurement and the second pulse width measurement; and
  instructions for causing the computer to generate the quadrature clock signal based on the in-phase clock signal and the filtered comparison output.

30. The computer-readable medium of claim 29, further comprising:
  instructions for causing the computer to divide the in-phase clock signal by an integer to generate a first mask pulse and a second mask pulse;
  instructions for causing the computer to generate a first latched clock output based on the in-phase clock signal, and a second latched clock output based on the quadrature clock signal; and
  instructions for causing the computer to perform a first logical AND operation of the second mask pulse and the first latched clock output to generate the first clock output, and to perform a second logical AND operation of the first mask pulse and the second latched clock output to generate the second clock output.

* * * * *